United States Patent
Zeng et al.

(10) Patent No.: US 10,658,065 B2
(45) Date of Patent: May 19, 2020

(54) FAILURE MODE DETECTION METHOD AND ERROR CORRECTION METHOD FOR SOLID STATE STORAGE DEVICE

(71) Applicant: SOLID STATE STORAGE TECHNOLOGY CORPORATION, Taipei (TW)

(72) Inventors: Shih-Jia Zeng, Taipei (TW); Jen-Chien Fu, Taipei (TW); Tsu-Han Lu, Taipei (TW); Kuan-Chun Chen, Taipei (TW)

(73) Assignee: SOLID STATE STORAGE TECHNOLOGY CORPORATION, Taipei (TW)

( * ) Notice: Subject to any disclaimer, the term of this patent is extended or adjusted under 35 U.S.C. 154(b) by 119 days.

(21) Appl. No.: 15/955,774

(22) Filed: Apr. 18, 2018

(65) Prior Publication Data

US 2019/0279735 A1    Sep. 12, 2019

(30) Foreign Application Priority Data

Mar. 9, 2018   (CN) .......................... 2018 1 0193995

(51) Int. Cl.
| | |
|---|---|
| *G11C 7/00* | (2006.01) |
| *G11C 29/44* | (2006.01) |
| *G06F 11/07* | (2006.01) |
| *G11C 16/26* | (2006.01) |
| *G11C 16/04* | (2006.01) |
| *G11C 11/56* | (2006.01) |

(52) U.S. Cl.
CPC ...... *G11C 29/4401* (2013.01); *G06F 11/0727* (2013.01); *G06F 11/0754* (2013.01); *G11C 11/5642* (2013.01); *G11C 16/0408* (2013.01); *G11C 16/26* (2013.01)

(58) Field of Classification Search
CPC ............ G11C 29/4401; G11C 11/5642; G11C 16/0408; G11C 16/26; G06F 11/0727; G06F 11/0754
USPC ........................................................ 365/201
See application file for complete search history.

(56) References Cited

U.S. PATENT DOCUMENTS

| | | | | |
|---|---|---|---|---|
| 8,953,373 | B1 * | 2/2015 | Wu .................... | G11C 16/3404 365/185.03 |
| 9,484,098 | B1 * | 11/2016 | Hsu ....................... | G11C 7/1006 |
| 9,490,024 | B1 * | 11/2016 | Zeng ....................... | G11C 16/26 |
| 9,514,848 | B2 * | 12/2016 | Wu ....................... | G11C 11/5642 |
| 9,548,127 | B1 * | 1/2017 | Takada .................... | G11C 16/26 |
| 9,640,281 | B1 * | 5/2017 | Seo ........................ | G06F 3/0604 |

(Continued)

*Primary Examiner* — Viet Q Nguyen
(74) *Attorney, Agent, or Firm* — WPAT, PC

(57) ABSTRACT

A failure mode detection method is provided. A first default read voltage is changed to a first read retry voltage by a first increment, and a second default read voltage is changed to a second read retry voltage by a second increment. A memory cell array of a solid state storage device is successfully read according to the first and second read retry voltages. If an absolute value of the first increment minus an absolute value of the second increment is larger than a predetermined voltage value, the memory cell array is in a data retention failure mode. If the absolute value of the first increment minus the absolute value of the second increment is smaller than the predetermined voltage value, the memory cell array is in a low temperature write high temperature read failure mode.

8 Claims, 7 Drawing Sheets

(56) References Cited

U.S. PATENT DOCUMENTS

| | | | |
|---|---|---|---|
| 9,653,157 B1* | 5/2017 | Kim | G11C 16/26 |
| 9,859,011 B1* | 1/2018 | Konno | G11C 16/26 |
| 9,922,706 B2* | 3/2018 | Zeng | G06F 11/1048 |
| 10,008,275 B1* | 6/2018 | Khwa | G11C 16/3418 |
| 10,115,468 B2* | 10/2018 | Zeng | G11C 16/26 |
| 10,319,428 B2* | 6/2019 | Zeng | G11C 16/32 |
| 10,347,330 B2* | 7/2019 | Zeng | G11C 16/28 |
| 2013/0016562 A1* | 1/2013 | Mun | G11C 11/5628 365/185.12 |
| 2013/0036261 A1* | 2/2013 | Kim | G06F 11/00 711/103 |
| 2013/0080858 A1* | 3/2013 | Lee | G11C 16/26 714/773 |
| 2013/0107633 A1* | 5/2013 | Kim | G11C 11/5642 365/185.18 |
| 2013/0297988 A1* | 11/2013 | Wu | G06F 11/1068 714/773 |
| 2014/0056068 A1* | 2/2014 | Strasser | G06F 11/1048 365/185.03 |
| 2014/0063967 A1* | 3/2014 | Ahn | G11C 16/26 365/185.18 |
| 2014/0101519 A1* | 4/2014 | Lee | G06F 11/1068 714/773 |
| 2014/0281767 A1* | 9/2014 | Alhussien | G11C 16/3404 714/721 |
| 2014/0281770 A1* | 9/2014 | Kim | G11C 29/021 714/721 |
| 2015/0019934 A1* | 1/2015 | Chae | G06F 11/1048 714/764 |
| 2015/0363264 A1* | 12/2015 | Cai | G06F 11/1068 714/6.11 |
| 2016/0042797 A1* | 2/2016 | Kim | G11C 16/26 714/764 |
| 2016/0124642 A1* | 5/2016 | Kim | G06F 3/061 711/156 |
| 2016/0125951 A1* | 5/2016 | Sun | G11C 11/5642 365/185.24 |
| 2016/0179615 A1* | 6/2016 | Lee | G11C 29/52 714/764 |
| 2016/0239381 A1* | 8/2016 | Nakazumi | G06F 11/1072 |
| 2016/0266970 A1* | 9/2016 | Amaki | G11C 16/26 |
| 2016/0267999 A1* | 9/2016 | Takeyama | G11C 16/28 |
| 2016/0357472 A1* | 12/2016 | Choi | G06F 11/0754 |
| 2017/0154657 A1* | 6/2017 | Kim | G11C 7/00 |
| 2017/0236592 A1* | 8/2017 | Alhussien | G11C 29/50004 714/721 |
| 2017/0287564 A1* | 10/2017 | Park | G11C 16/26 |
| 2018/0081575 A1* | 3/2018 | Takada | G06F 11/1048 |
| 2018/0158493 A1* | 6/2018 | Ryu | G11C 7/1006 |
| 2018/0188953 A1* | 7/2018 | Wang | G06F 3/0655 |
| 2018/0197619 A1* | 7/2018 | Chen | G11C 29/028 |
| 2018/0246782 A1* | 8/2018 | Zeng | G11C 29/42 |
| 2019/0130967 A1* | 5/2019 | Danjean | G11C 11/5642 |
| 2019/0180829 A1* | 6/2019 | Chen | G11C 11/5642 |
| 2019/0198121 A1* | 6/2019 | Choo | G11C 11/5671 |
| 2019/0267098 A1* | 8/2019 | Jung | G11C 16/3454 |
| 2019/0267100 A1* | 8/2019 | Pan | G11C 16/26 |
| 2019/0286442 A1* | 9/2019 | Takizawa | G11C 7/04 |
| 2019/0286518 A1* | 9/2019 | Asami | G06F 11/1068 |
| 2019/0295659 A1* | 9/2019 | Hong | G11C 16/26 |
| 2019/0325969 A1* | 10/2019 | Hong | G11C 29/42 |
| 2019/0348133 A1* | 11/2019 | Chen | G06F 3/0656 |
| 2019/0362796 A1* | 11/2019 | Choi | G11C 11/5628 |

* cited by examiner

US 10,658,065 B2

FAILURE MODE DETECTION METHOD AND ERROR CORRECTION METHOD FOR SOLID STATE STORAGE DEVICE

This application claims the benefit of People's Republic of China Patent Application No. 201810193995.6, filed Mar. 9, 2018, the subject matter of which is incorporated herein by reference.

FIELD OF THE INVENTION

The present invention relates to a processing method for a solid state storage device, and more particularly to a failure mode detection method and an error correction method for a solid state storage device.

BACKGROUND OF THE INVENTION

As is well known, solid state storage devices such as SD cards or solid state drives (SSD) are widely used in a variety of electronic devices.

Generally, a solid state storage device comprises a non-volatile memory. After data are written to the non-volatile memory, if no electric power is supplied to the solid state storage device, the data are still retained in the non-volatile memory.

FIG. 1 is a schematic functional block diagram illustrating the architecture of a conventional solid state storage device. As shown in FIG. 1, the solid state storage device 10 comprises an interface controller 101 and a non-volatile memory 105. The non-volatile memory 105 further comprises a memory cell array 109 and an array control circuit 111.

The solid state storage device 10 is connected with a host 14 through an external bus 12. For example, the external bus 12 is a USB bus, a SATA bus, a PCIe bus, a M.2 bus, a U.2 bus, or the like.

Moreover, the interface controller 101 is connected with the non-volatile memory 105 through an internal bus 113. According to a write command from the host 14, the interface controller 101 controls the array control circuit 111 to store the write data from the host 14 to the memory cell array 109. Alternatively, according to a read command from the host 14, the interface controller 101 controls the array control circuit 111 to acquire a read data from the memory cell array 109. In addition, the read data is transmitted to the host 14 through the interface controller 101.

Generally, the interface controller 101 stores a default read voltage set. During a read cycle, the interface controller 101 transmits an operation command to the array control circuit 111 of the non-volatile memory 105 through the internal bus 113. Consequently, the interface controller 101 allows the array control circuit 111 to read the previously-stored data from the memory cell array 109 of the non-volatile memory 105 according to the default read voltage set.

The interface controller 101 further comprises an error correction code (ECC) circuit 104 for correcting the error bits of the read data. After the error bits of the read data are corrected, the accurate read data is transmitted to the host 14. However, if the ECC circuit 104 is unable to successfully correct all bits of the read data, the accurate read data cannot be outputted to the host 14. Under this circumstance, the interface controller 101 provides other read retry voltage sets. According to the read retry voltage sets, the interface controller 101 performs a read retry operation on the non-volatile memory 105. The operating principles will be described as follows.

Depending on the data amount to be stored in the memory cell, the memory cells may be classified into four types, i.e. a single-level cell (SLC), a multi-level cell (MLC), a triple-level cell (TLC) and a quad-level cell (QLC). The SLC can store only one bit of data per cell. The MLC can store two bits of data per cell. The TLC can store three bits of data per cell. The QLC can store four bits of data per cell. The memory cell array 109 can be a SLC memory cell array, a MLC memory cell array, a TLC memory cell array or a QLC memory cell array.

In the memory cell array 109, each memory cell comprises a floating gate transistor. By adjusting the number of hot carriers injected into a floating gate of the floating gate transistor, the array control circuit 111 controls the storing state of the floating gate transistor. In other words, the floating gate transistor of each SLC has two storing states, the floating gate transistor of each MLC has four storing states, the floating gate transistor of each TLC has eight storing states, and the floating gate transistor of each QLC has sixteen storing states.

FIG. 2A schematically illustrates the ideal threshold voltage distribution curves of single-level cells in different storing states. According to the number of injected hot carriers, the single-level cell has two storing states "Erase" and "A". Before the hot carriers are injected into the memory cell, the memory cell is in the storing state "Erase". After the hot carriers are injected into the memory cell, the memory cell is in the storing state "A". The memory cell in the storing state "A" has the higher threshold voltage, and the memory cell in the storing state "Erase" has the lower threshold voltage. After an erase cycle is performed on the memory cell, the memory cell is restored to the storing state "Erase", and no hot carriers are retained in the memory cell.

In practice, even if many memory cells are in the same storing state during the program cycle, the threshold voltages of these memory cells are not all identical. That is, the threshold voltages of these memory cells are distributed in a specified distribution curve with a median threshold voltage. As shown in FIG. 2A, the median threshold voltage of the memory cells in the storing state "Erase" is Ver, and the median threshold voltage of the memory cells in the storing state "A" is Va. For example, the median threshold voltage for a greater number of memory cells in the storing state "A" is Va.

Please refer to FIG. 2A again. According to the above characteristics of the single-level cell, a default read voltage set including one read voltage Vra is defined. During the read cycle, the interface controller 101 provides the read voltage Vra of the default read voltage set to the array control circuit 111 in order to detect the storing states of the single-level cells of the memory cell array 109.

As shown in FIG. 2A, the storing states of the single-level cells are determined according to the read voltage Vra of the default read voltage set. For example, the read voltage Vra is provided from the array control circuit 111 to the memory cell array 109. If the threshold voltage of the memory cell is higher than the read voltage Vra and the memory cell cannot be turned on, the array control circuit 111 judges that the memory cell is in the storing state "A". Whereas, if the threshold voltage of the memory cell is lower than the read voltage Vra and the memory cell is turned on, the array control circuit 111 judges that the memory cell is in the storing state "Erase".

Similarly, the default read voltage set for the multi-level cell includes three read voltages. The four storing states of the multi-level cells are determined according to three read voltages of the default read voltage set.

Similarly, the default read voltage set for the triple-level cell includes seven read voltages. The eight storing states of the triple-level cells are determined according to seven read voltages of the default read voltage set.

Similarly, the default read voltage set for the quad-level cell includes fifteen read voltages. The sixteen storing states of the quad-level cells are determined according to fifteen read voltages of the default read voltage set.

However, since the operating conditions of the solid state storage device 10 are different, the threshold voltage distribution curves of the memory cells in the memory cell array 109 are possibly distorted or shifted. If the threshold voltage distribution curves of the memory cells are seriously distorted or shifted, the memory cells are in a failure mode. In the failure mode, the interface controller 101 cannot generate the accurate read data. Some types of the failure mode of the single-level cells will be described as follows.

FIG. 2B schematically illustrates the shift of the threshold voltage distribution curves of single-level cells in a read disturb failure mode. After the single-level cells have been read many times, the threshold voltages of a portion of the memory cells with the storing state "Erase" will be increased. If the threshold voltage of the memory cell is increased to a very high value, the portion of the memory cell is misjudged to have the storing state "A". Under this circumstance, the data is erroneously read. Meanwhile, the memory cell is in the read disturb failure mode.

FIG. 2C schematically illustrates the shift of the threshold voltage distribution curves of single-level cells in a room temperature data retention (RTDR) failure mode. When the single-level cells are operated in the room temperature situation, the hot carriers in the floating gates are possibly lost. Consequently, the threshold voltages of a portion of the memory cells with the storing state "A" are decreased. If the threshold voltage of the memory cell is decreased to a very low value, the portion of the memory cell is misjudged to have the storing state "Erase". Under this circumstance, the data is erroneously read. Meanwhile, the memory cell is in the room temperature data retention (RTDR) failure mode.

FIG. 2D schematically illustrates the shift of the threshold voltage distribution curves of single-level cells in a high temperature data retention (HTDR) failure mode. When the single-level cells are operated in the high temperature situation, the hot carriers in the floating gates are easily lost and the threshold voltage distribution curve of the storing state "A" are shifted to the left. That is, the threshold voltages of all memory cells with the storing state "A" are decreased. If the threshold voltage of the memory cell is decreased to a very low value, the memory cell is misjudged to have the storing state "Erase". Under this circumstance, the data is erroneously read. In other words, the memory cell is in the high temperature data retention (HTDR) failure mode. In the HTDR failure mode, the interface controller 101 judges the storing states of the single-level cells according to a read voltage Vra'.

FIG. 2E schematically illustrates the shift of the threshold voltage distribution curves of single-level cells in an F-poly coupling failure mode. When the single-level cells are programmed, the threshold voltages of the neighboring memory cells are influenced and the threshold voltage distribution curve of the storing state "A" are shifted to the right and widened. Under this circumstance, the data is erroneously read. Meanwhile, the memory cell is in the F-poly coupling failure mode.

FIG. 2F schematically illustrates the shift of the threshold voltage distribution curves of single-level cells in an endurance failure mode. When the single-level cells have been programmed and erased many times, the threshold voltage distribution curve of the storing state "A" are shifted to the right and widened. Under this circumstance, the data is erroneously read. Meanwhile, the memory cell is in the endurance failure mode.

As mentioned above, if the threshold voltage distribution curves of memory cells in the memory cell array 109 are seriously distorted or shifted, the interface controller 101 cannot generate the accurate read data. That is, when the interface controller 101 determines the storing states of the single-level cells according to the read voltage Vra, the read data contains so many error bits. Since the ECC circuit 104 is unable to successfully correct all bits of the read data, the data is erroneously read. Meanwhile, the interface controller 101 has to provide another read retry voltage Vra' to perform the read retry process.

FIG. 3 is a flowchart illustrating an error correction method for a solid state storage device according to the prior art. During the read cycle, the interface controller 101 firstly performs a decoding process S1. In the decoding process S1, a hard decoding operation is performed according to a default read voltage set. That is, the interface controller 101 provides the default read voltage set to the non-volatile memory 105, and the ECC circuit 104 performs the hard decoding operation to correct the read data.

If the error bits in the read data can be corrected, it means that the decoding operation is successfully done and the decoding process S1 is passed. Consequently, the accurate read data is transmitted from the interface controller 101 to the host 14. Whereas, if the error bits in the read data cannot be corrected, the read data is not accurately acquired and the decoding process S1 is failed. Then, the interface controller 101 performs a read retry process.

After the interface controller 101 enters the read retry process, a decoding process S2 is firstly performed. In the decoding process S2, a hard decoding operation is performed according to a read retry voltage set. For example, the interface controller 101 provides the read retry voltage set to the non-volatile memory 105 to acquire the read data. Then, the ECC circuit 104 performs the hard decoding operation to correct the read data. If the error bits in the read data can be corrected, it means that the decoding operation is successfully done and the decoding process S2 is passed. Consequently, the accurate read data is transmitted from the interface controller 101 to the host 14. Whereas, if the error bits in the read data cannot be corrected, the read data is not accurately acquired and the decoding process S2 is failed.

Generally, plural read retry voltage sets (e.g., M read retry voltage sets) are stored in the interface controller 101. If the decoding operation is successfully done according to one of the plural read retry voltage sets, it means that the decoding process S2 is passed. Whereas, if the data cannot be successfully decoded according to all of the plural read retry voltage sets, it means that the decoding process S2 is failed. Then, the interface controller 101 performs a decoding process S3. Obviously, the time period of performing the decoding process S2 is longer than the time period of performing the decoding process S1.

In the decoding process S3, a soft decoding operation is performed according to the read retry voltage set. Generally, the soft decoding operation has better error correction capability than the hard decoding operation. However, while the soft decoding operation is performed, the interface controller 101 acquires a read data according to many read retry voltage sets. In other words, the time period of performing the soft decoding operation is longer. That is, the time period of performing the decoding process S3 is longer than the time period of performing the decoding process S2.

Similarly, if the decoding operation is successfully done by the interface controller 101, it means that the decoding process S3 is passed. Consequently, the accurate read data is transmitted from the interface controller 101 to the host 14. Whereas, if the data cannot be successfully decoded by the interface controller 101, it means that the decoding process S3 is failed. Under this circumstance, the interface controller 101 confirms that the accurate read data cannot be acquired and generates a failed message to the host 14 to indicate that the whole decoding process is failed.

As mentioned above, if the decoding process S1 is failed, the interface controller 101 enters the read retry process. In the read retry process, the interface controller 101 has to perform the decoding process S2 at first. If the interface controller 101 confirms that the decoding process S2 is failed, the interface controller 101 performs the decoding process S3. If the interface controller 101 confirms that the decoding process S3 is failed, the interface controller 101 issues the failed message to the host 14.

With increasing development of the semiconductor manufacturing process, the memory cell array with a 3D structure has been introduced into the market. Similarly, in many operating conditions, the memory cell array with the 3D structure is possibly suffered from many failure modes and subjected to many read retry processes. Therefore, it is important to reduce the time period of performing the read retry process.

SUMMARY OF THE INVENTION

An embodiment of the present invention provides a failure mode detection method for a solid state storage device. The failure mode detection method includes the following steps. Firstly, a first default read voltage is changed to a first read retry voltage by a first increment, and a second default read voltage is changed to a second read retry voltage by a second increment. When a memory cell array of the solid state storage device is read according to the first read retry voltage and the second read retry voltage, an accurate read data is generated. If an absolute value of the first increment minus an absolute value of the second increment is larger than a predetermined voltage value, the memory cell array of the solid state storage device is in a data retention failure mode. If the absolute value of the first increment minus the absolute value of the second increment is not larger than the predetermined voltage value, the memory cell array of the solid state storage device is in a low temperature write high temperature read failure mode.

Another embodiment of the present invention provides a failure mode detection method for a solid state storage device. The failure mode detection method includes the following steps. Firstly, a first default read voltage is changed to a first read retry voltage by a first increment, and a second default read voltage is changed to a second read retry voltage by a second increment. When a memory cell array of the solid state storage device is read according to the first read retry voltage and the second read retry voltage, an accurate read data is generated. If the first increment is positive and a data storage time exceeds a predetermined time period, the memory cell array of the solid state storage device is in a high temperature write low temperature read failure mode. If the first increment is positive and the data storage time does not exceed the predetermined time period, the memory cell array of the solid state storage device is in a program disturb failure mode.

A further embodiment of the present invention provides an error correction method for a solid state storage device. The error correction method includes the following steps. Firstly, a specified failure mode of a memory cell array of the solid state storage device is recognized. Then, m read retry voltage sets are selected from M read retry voltage sets, wherein the m read retry voltage sets are related with the specified failure mode and M is larger than m. Then, a read retry process is performed according to the m read retry voltage sets.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

With increasing development of the semiconductor manufacturing process, the structure of the memory cell array becomes more complicated and the capacity of the memory cell array is gradually increased. In many operating conditions, the memory cell array is possibly suffered from many failure modes. Hereinafter, the failure modes of the triple-level cells are taken as examples. It is noted that the concepts of the present invention are not restrictedly applied to the triple-level cells. That is, the concepts of the present invention can be applied to various memory cells.

Figure 4:
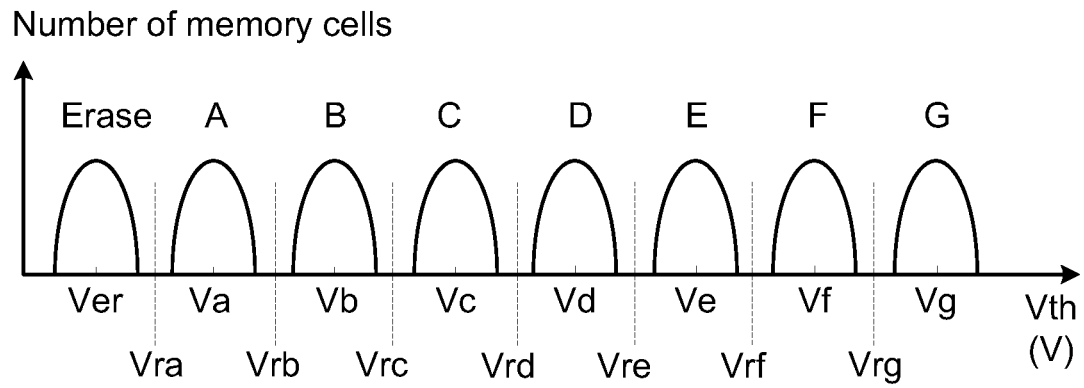
FIG. 4 schematically illustrates the ideal threshold voltage distribution curves of triple-level cells in different storing states.

FIG. 4 schematically illustrates the ideal threshold voltage distribution curves of triple-level cells in different storing states. According to the number of injected hot carriers, the triple-level cell has eight storing states "Erase" and "A"~"G". Before the hot carriers are injected into the memory cell, the memory cell is in a storing state "Erase". As the number of the injected hot carriers increases, the memory cell is sequentially in the other seven storing states "A"~"G". For example, the memory cell in the storing state "G" has the highest threshold voltage, and the memory cell in the storing state "Erase" has the lowest threshold voltage. After an erase cycle, the memory cell is restored to the storing state "Erase", and no hot carriers are retained in the memory cell.

Please refer to FIG. 4 again. The median threshold voltage of the memory cells in the storing state "Erase" is Ver. The median threshold voltage of the memory cells in the storing state "A" is Va. The median threshold voltage of the memory cells in the storing state "B" is Vb. The median threshold voltage of the memory cells in the storing state "C" is Vc. The median threshold voltage of the memory cells in the storing state "D" is Vd. The median threshold voltage of the memory cells in the storing state "E" is Ve. The median threshold voltage of the memory cells in the storing state "F" is Vf. The median threshold voltage of the memory cells in the storing state "G" is Vg. For example, the median threshold voltage for a greater number of memory cells in the storing state "A" is Va.

According to the threshold voltage distribution curves of triple-level cells in different storing states, a default read voltage set including seven read voltages Vra~Vrg is defined. During the read cycle, the interface controller 101 provides the default read voltage set to the array control circuit 111 in order to detect the storing states of the triple-level cells of the memory cell array 109.

The storing states of the triple-level cells are determined according to the read voltages Vra~Vrg. For example, the read voltage Vrg is provided from the array control circuit 111 to the memory cell array 109. If the threshold voltage of the memory cell is higher than the read voltage Vrg and the memory cell is not turned on, the array control circuit 111 judges that the memory cell is in the storing state "G". Whereas, if the threshold voltage of the memory cell is lower than the read voltage Vrg and the memory cell is turned on, the array control circuit 111 judges that the memory cell is not in the storing state "G". In other words, the eight storing states of the triple-level cells are determined according to the seven read voltages Vra~Vrg of the default read voltage set.

Figure 5A:
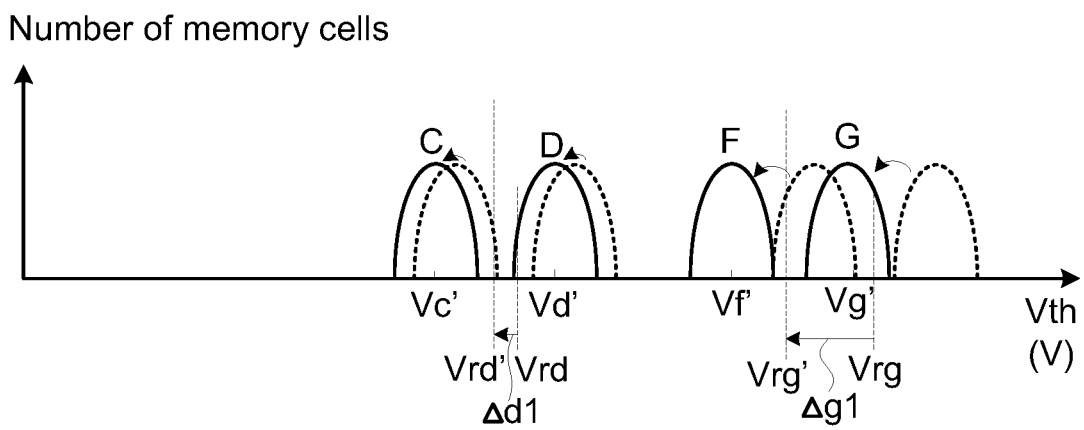
FIG. 5A schematically illustrates the shift of the threshold voltage distribution curves of triple-level cells in a data retention (DR) failure mode.

FIG. 5A schematically illustrates the shift of the threshold voltage distribution curves of triple-level cells in a data retention (DR) failure mode. While the memory cell is programmed to the storing state "G", the number of hot carriers injected into the memory cell is the highest. Consequently, after the memory cells in the storing state "G" have been stored for a certain time period, the floating gates of the memory cells have more carrier loss. Consequently, the threshold voltage distribution curve is seriously shifted to the left. In case that the memory cells are in a storing state corresponding to a higher threshold voltage, the threshold voltage distribution curve has a larger shift to the left. Whereas, in case that the memory cells are in a storing state corresponding to a lower threshold voltage, the threshold voltage distribution curve has a smaller shift to the left. If the threshold voltage of the memory cell is largely decreased, the storing state of the memory cell is misjudged. Under this circumstance, the data is erroneously read. Meanwhile, the memory cell is in the data retention (DR) failure mode.

In FIG. 5A, only the threshold voltage distribution curves corresponding to the storing states "C", "D", "F" and "G" are shown. The dotted curves indicate the ideal threshold voltage distribution curves of the triple-level cells. Moreover, the read retry voltage Vrd' is lower than the read retry voltage Vrg'.

In the DR failure mode, the threshold voltage distribution curves corresponding to the storing states "F" and "G" have the largest shifts to the left. Since the threshold voltage distribution curve corresponding to the storing states "F" is shifted, the median threshold voltage of the memory cells in the storing state "F" is changed to Vf'. Similarly, since the threshold voltage distribution curve corresponding to the storing states "G" is shifted, the median threshold voltage of the memory cells in the storing state "G" is changed to Vg'. During the read retry process, the interface controller 101 provide the read retry voltage Vrg' to effectively discriminate the storing state "F" from the storing state "G". In comparison with the default read voltage Vrg, the read retry voltage Vrg' has a shift $\Delta g1$ to the left. That is, the read retry voltage Vrg' has a negative increment $\Delta g1$.

In the DR failure mode, the threshold voltage distribution curves corresponding to the storing states "C" and "D" have the smaller shifts to the left. Since the threshold voltage distribution curve corresponding to the storing states "C" is shifted, the median threshold voltage of the memory cells in the storing state "C" is changed to Vc'. Similarly, since the threshold voltage distribution curve corresponding to the storing states "D" is shifted, the median threshold voltage of the memory cells in the storing state "D" is changed to Vd'. During the read retry process, the interface controller 101 provide the read retry voltage Vrd' to effectively discriminate the storing state "C" from the storing state "D". In comparison with the default read voltage Vrd, the read retry voltage Vrd' has a shift $\Delta d1$ to the left. That is, the read retry voltage Vrd' has a negative increment $\Delta d1$. The absolute value of the increment $\Delta g1$ is larger than the absolute value of the increment $\Delta d1$.

In case that the absolute value of the increment Δg1 corresponding to the read retry voltage Vrg' is larger than the absolute value of the increment Δd1 corresponding to the read retry voltage Vrd', the interface controller 101 judges that the memory cell array 109 is in the DR failure mode.

Figure 5B:
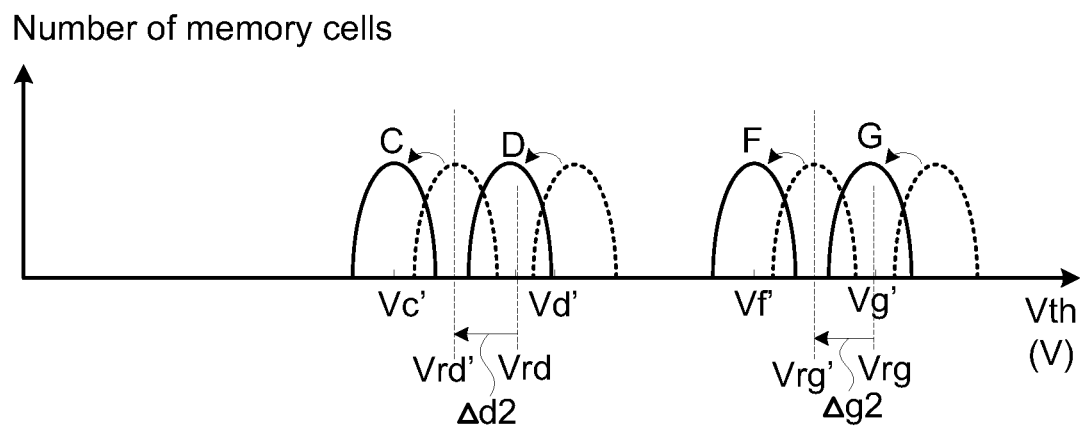
FIG. 5B schematically illustrates the shift of the threshold voltage distribution curves of triple-level cells in a low temperature write high temperature read (LTW-HTR) failure mode.

FIG. 5B schematically illustrates the shift of the threshold voltage distribution curves of triple-level cells in a low temperature write high temperature read (LTW-HTR) failure mode. Since the memory cells are programmed at the low temperature and read at the high temperature, the floating gates of the memory cells have carrier loss. Consequently, the threshold voltage distribution curve is shifted to the left. If the threshold voltage distribution curve is largely shifted to the left, the storing state of the memory cell is misjudged. Under this circumstance, the data is erroneously read. Meanwhile, the memory cell is in the low temperature write high temperature read (LTW-HTR) failure mode.

In FIG. 5B, only the threshold voltage distribution curves corresponding to the storing states "C", "D", "F" and "G" are shown. The dotted curves indicate the ideal threshold voltage distribution curves of the triple-level cells. Moreover, the read retry voltage Vrd' is lower than the read retry voltage Vrg'.

In the LTW-HTR failure mode, the threshold voltage distribution curves corresponding to the storing states "C", "D", "F" and "G" are all shifted to the left. Since the threshold voltage distribution curve corresponding to the storing states "C" is shifted, the median threshold voltage of the memory cells in the storing state "C" is changed to Vc'. Similarly, since the threshold voltage distribution curve corresponding to the storing states "D" is shifted, the median threshold voltage of the memory cells in the storing state "D" is changed to Vd'. Since the threshold voltage distribution curve corresponding to the storing states "F" is shifted, the median threshold voltage of the memory cells in the storing state "F" is changed to Vf'. Similarly, since the threshold voltage distribution curve corresponding to the storing states "G" is shifted, the median threshold voltage of the memory cells in the storing state "G" is changed to Vg'.

During the read retry process, the interface controller 101 provide the read retry voltage Vrd' to effectively discriminate the storing state "C" from the storing state "D" and the interface controller 101 provide the read retry voltage Vrg' to effectively discriminate the storing state "F" from the storing state "G".

In comparison with the default read voltage Vrd, the read retry voltage Vrd' has a shift Δd2 to the left. That is, the read retry voltage Vrd' has a negative increment Δd2. In comparison with the default read voltage Vrg, the read retry voltage Vrg' has a shift Δg2 to the left. That is, the read retry voltage Vrg' has a negative increment Δg2. The absolute value of the increment Δg2 is approximately equal to the absolute value of the increment Δd2.

In case that the absolute value of the increment Δg2 corresponding to the read retry voltage Vrg' is approximately equal to the absolute value of the increment Δd2 corresponding to the read retry voltage Vrd', the interface controller 101 judges that the memory cell array 109 is in the LTW-HTR failure mode.

Figure 6:
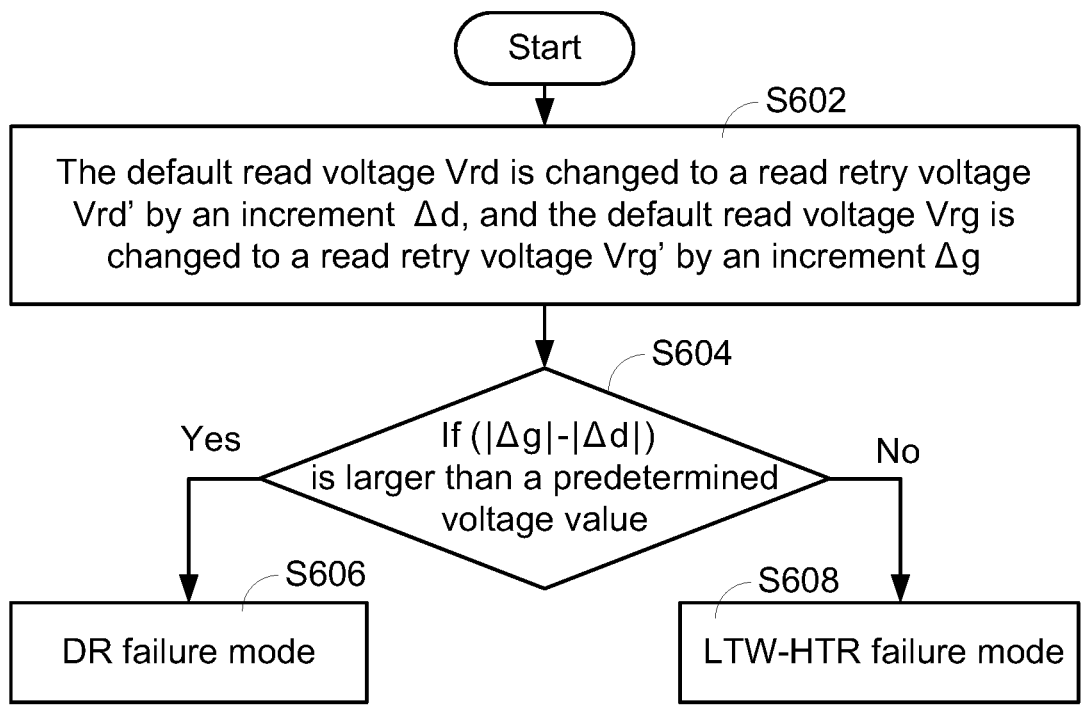
FIG. 6 is a flowchart illustrating a failure mode detection method for a solid state storage device according to a first embodiment of the present invention.

According to the above characteristics of the memory cells, the present invention provides a failure mode detection method. FIG. 6 is a flowchart illustrating a failure mode detection method for a solid state storage device according to a first embodiment of the present invention.

If the interface controller 101 provides the default read voltage set to the non-volatile memory 105 and is unable to acquire the accurate read data, the interface controller 101 enters a read retry process. If the accurate read data is acquired after the read retry process, the accurate read data is transmitted to the host 14. In addition, the interface controller 101 judges the failure mode of the solid state storage device 10 according to the read retry voltages of the read retry voltage set that is able to successfully decode the read data.

In a step S602, the default read voltage Vrd is changed to a read retry voltage Vrd' by an increment Δd, and the default read voltage Vrg is changed to a read retry voltage Vrg' by an increment Δg. According to the read retry voltages Vrd' and Vrg' of the read retry voltage set, the interface controller 101 can acquire the accurate read data during the read cycle of the memory cell array 109.

Then, a step S604 is performed to judge whether the absolute value of the increment Δg minus the absolute value of the increment Δd (i.e., |Δg|−|Δd|) is larger than a predetermined voltage value.

If the absolute value of the increment Δg minus the absolute value of the increment Δd is larger than the predetermined voltage value, it means that the difference between the absolute value of the increment Δg and the increment Δd is very large. Meanwhile, the interface controller 101 judges that the memory cell array 109 is in the DR failure mode (Step S606). Whereas, if the absolute value of the increment Δg minus the absolute value of the increment Δd is not larger than the predetermined voltage value, it means that the difference between the absolute value of the increment Δg and the increment Δd is not large. Meanwhile, the interface controller 101 judges that the memory cell array 109 is in the LTW-HTR failure mode (Step S608).

Figure 7A:
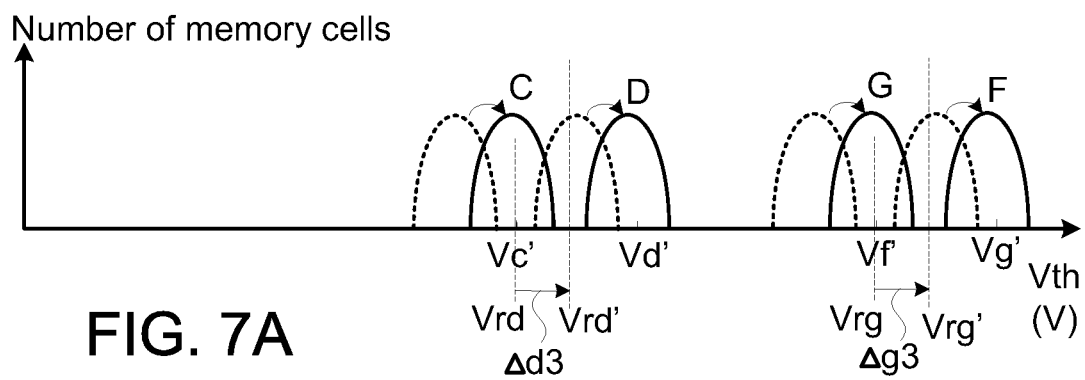
FIG. 7A schematically illustrates the shift of the threshold voltage distribution curves of triple-level cells in a high temperature write low temperature read (HTW-LTR) failure mode.

FIG. 7A schematically illustrates the shift of the threshold voltage distribution curves of triple-level cells in a high temperature write low temperature read (HTW-LTR) failure mode. Since the memory cells are programmed at the high temperature and read at the low temperature, hot carriers are possibly injected into the floating gates of the memory cells again. Consequently, the threshold voltage distribution curve is shifted to the right. If the threshold voltage distribution curve is largely shifted to the right, the storing state of the memory cell is misjudged. Under this circumstance, the data is erroneously read. Meanwhile, the memory cell is in the high temperature write low temperature read (HTW-LTR) failure mode.

In FIG. 7A, only the threshold voltage distribution curves corresponding to the storing states "C", "D", "F" and "G" are shown. The dotted curves indicate the ideal threshold voltage distribution curves of the triple-level cells. Moreover, the read retry voltage Vrd' is lower than the read retry voltage Vrg'.

In the HTW-LTR failure mode, the threshold voltage distribution curves corresponding to the storing states "C", "D", "F" and "G" are all shifted to the right. Since the threshold voltage distribution curve corresponding to the storing states "C" is shifted, the median threshold voltage of the memory cells in the storing state "C" is changed to Vc'. Similarly, since the threshold voltage distribution curve corresponding to the storing states "D" is shifted, the median threshold voltage of the memory cells in the storing state "D" is changed to Vd'. Since the threshold voltage distribution curve corresponding to the storing states "F" is shifted, the median threshold voltage of the memory cells in the storing state "F" is changed to Vf'. Similarly, since the threshold voltage distribution curve corresponding to the storing states "G" is shifted, the median threshold voltage of the memory cells in the storing state "G" is changed to Vg'.

During the read retry process, the interface controller 101 provide the read retry voltage Vrd' to effectively discriminate the storing state "C" from the storing state "D" and the interface controller 101 provide the read retry voltage Vrg' to effectively discriminate the storing state "F" from the storing state "G".

In comparison with the default read voltage Vrd, the read retry voltage Vrd' has a shift $\Delta d3$ to the right. That is, the read retry voltage Vrd' has a positive increment $\Delta d3$. In comparison with the default read voltage Vrg, the read retry voltage Vrg' has a shift $\Delta g3$ to the right. That is, the read retry voltage Vrg' has a positive increment $\Delta g3$. The absolute value of the increment $\Delta d3$ is approximately equal to the absolute value of the increment $\Delta g3$.

In case that the absolute value of the increment $\Delta g3$ corresponding to the read retry voltage Vrg' is approximately equal to the absolute value of the increment $\Delta d3$ corresponding to the read retry voltage Vrd', the interface controller 101 judges that the memory cell array 109 is in the HTW-LTR failure mode.

Figure 7B:
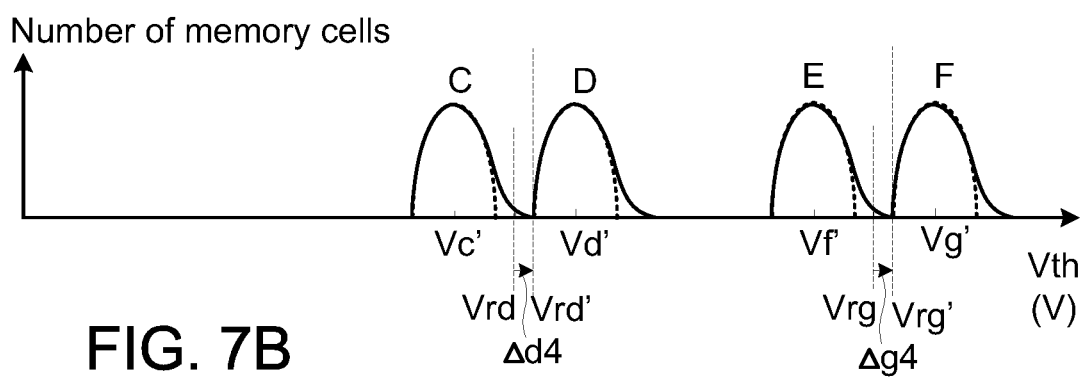
FIG. 7B schematically illustrates the shift of the threshold voltage distribution curves of triple-level cells in a program disturb failure mode.

FIG. 7B schematically illustrates the shift of the threshold voltage distribution curves of triple-level cells in a program disturb failure mode. After the memory cells have been programmed and stored for a time period shorter than a certain time period, the threshold voltage distribution curve is shifted to the right. If the threshold voltage distribution curve is largely shifted to the right, the storing state of the memory cell is misjudged. Under this circumstance, the data is erroneously read. Meanwhile, the memory cell is in the program disturb failure mode. Generally, the memory cells are in the program disturb failure mode after the memory cells have been programmed stored for the time period shorter than the certain time period. After the memory cells have been programmed stored for the time period longer than the certain time period, the characteristics of the memory cells are gradually stabilized and the memory cells are not in the program disturb failure mode.

In FIG. 7B, only the threshold voltage distribution curves corresponding to the storing states "C", "D", "F" and "G" are shown. The dotted curves indicate the ideal threshold voltage distribution curves of the triple-level cells. Moreover, the read retry voltage Vrd' is lower than the read retry voltage Vrg'.

In the program disturb failure mode, the threshold voltage distribution curves corresponding to the storing states "C", "D", "F" and "G" are all slightly shifted to the right. During the read retry process, the interface controller 101 provide the read retry voltage Vrd' to effectively discriminate the storing state "C" from the storing state "D" and the interface controller 101 provide the read retry voltage Vrg' to effectively discriminate the storing state "F" from the storing state "G".

Figure 8:
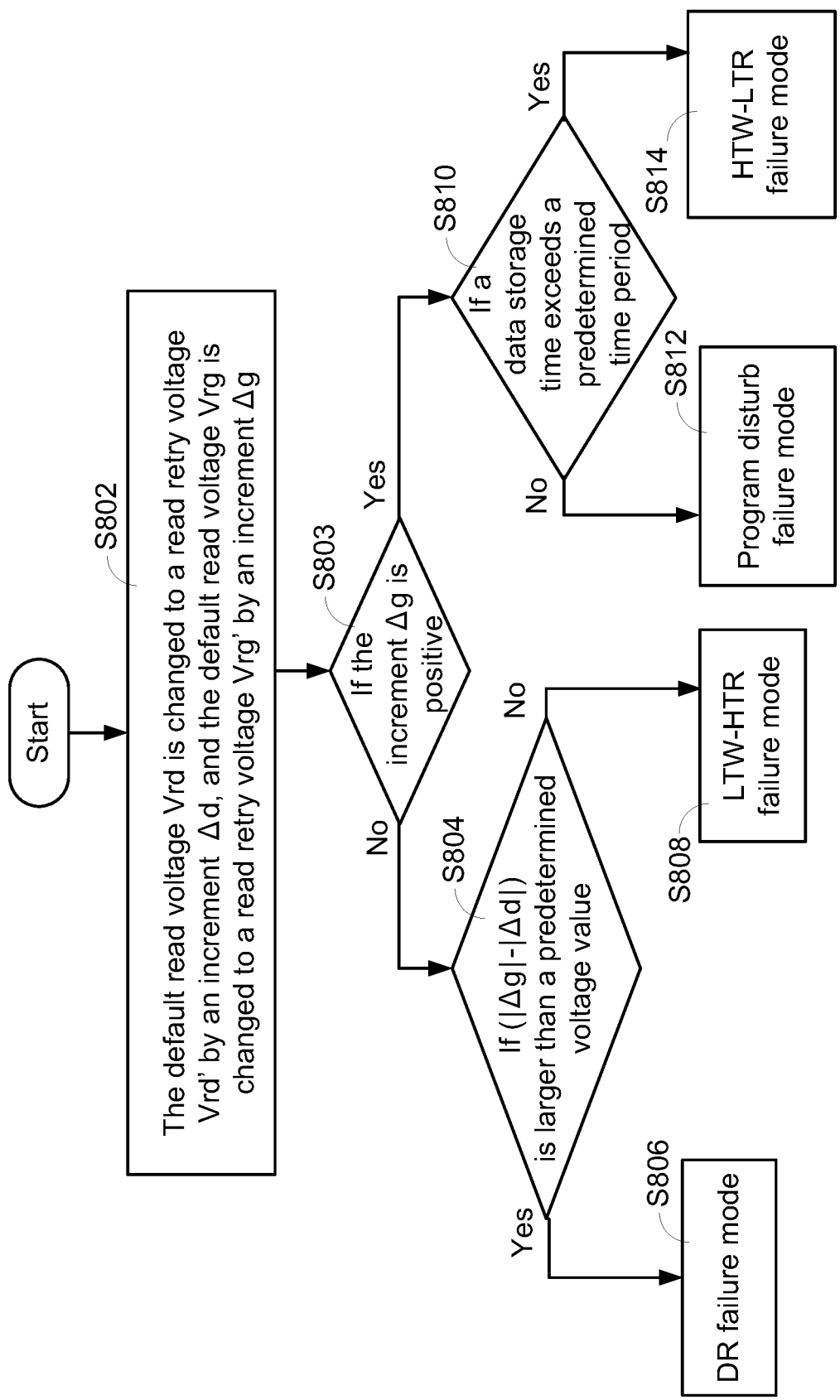
FIG. 8 is a flowchart illustrating a failure mode detection method for a solid state storage device according to a second embodiment of the present invention.

According to the above characteristics of the memory cells, the present invention provides a failure mode detection method. FIG. 8 is a flowchart illustrating a failure mode detection method for a solid state storage device according to a second embodiment of the present invention.

If the interface controller 101 provides the default read voltage set to the non-volatile memory 105 and is unable to acquire the accurate read data, the interface controller 101 enters a read retry process. If the accurate read data is acquired after the read retry process, the accurate read data is transmitted to the host 14. In addition, the interface controller 101 judges the failure mode of the solid state storage device 10 according to the read retry voltages of the read retry voltage set that is able to successfully decode the read data.

In a step S802, the default read voltage Vrd is changed to a read retry voltage Vrd' by an increment $\Delta d$ and the default read voltage Vrg is changed to a read retry voltage Vrg' by an increment $\Delta g$. According to the read retry voltages Vrd' and Vrg' of the read retry voltage set, the interface controller 101 can acquire the accurate read data during the read cycle of the memory cell array 109.

Then, a step S803 is performed to judge whether the increment $\Delta g$ is positive. If the increment $\Delta g$ is positive, it means that the threshold voltage distribution curves corresponding to the storing state are shifted to the right. Then, a step S810 is performed to judge whether a data storage time exceeds a predetermined time period.

If the data storage time does not exceed the predetermined time period, the interface controller 101 judges that the memory cell array 109 is in the program disturb failure mode (Step S812). Whereas, if the data storage time does exceeds the predetermined time period, the interface controller 101 judges that the memory cell array 109 is in the HTW-LTR failure mode (Step S814).

If the increment $\Delta g$ is negative, it means that the threshold voltage distribution curves corresponding to the storing state are shifted to the left. Then, a step S804 is performed to judge whether the absolute value of the increment $\Delta g$ minus the absolute value of the increment $\Delta d$ (i.e., $|\Delta g|-|\Delta d|$) is larger than a predetermined voltage value.

If the absolute value of the increment $\Delta g$ minus the absolute value of the increment $\Delta d$ is larger than the predetermined voltage value, it means that the difference between the absolute value of the increment $\Delta g$ and the increment $\Delta d$ is very large. Meanwhile, the interface controller 101 judges that the memory cell array 109 is in the DR failure mode (Step S806). Whereas, if the absolute value of the increment $\Delta g$ minus the absolute value of the increment $\Delta d$ is not larger than the predetermined voltage value, it means that the difference between the absolute value of the increment $\Delta g$ and the increment $\Delta d$ is not large. Meanwhile, the interface controller 101 judges that the memory cell array 109 is in the LTW-HTR failure mode (Step S808).

Figure 1:
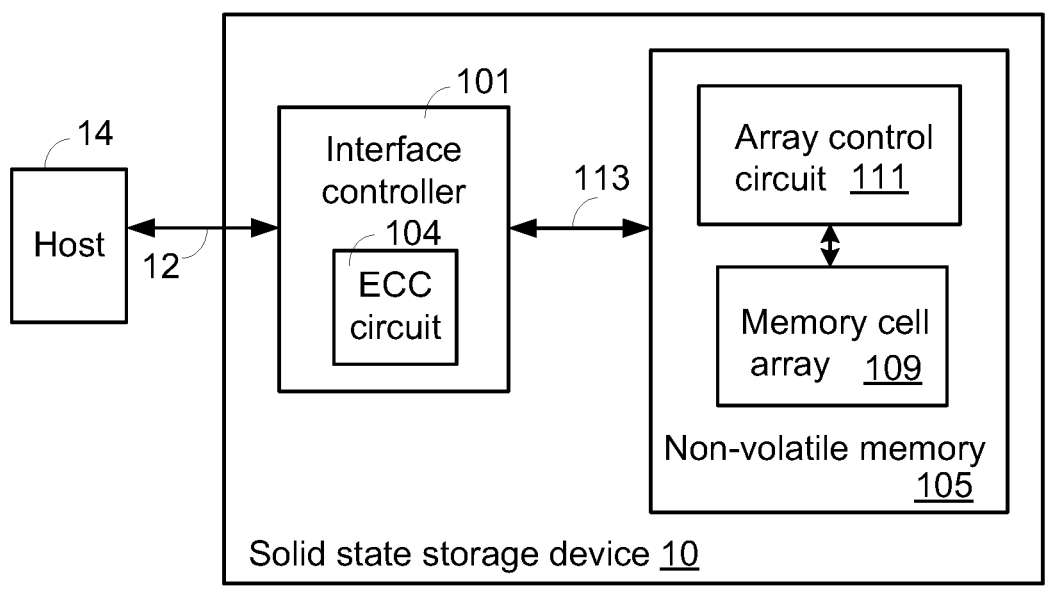
FIG. 1 (prior art) is a schematic functional block diagram illustrating the architecture of a conventional solid state storage device.
Figure 2A:
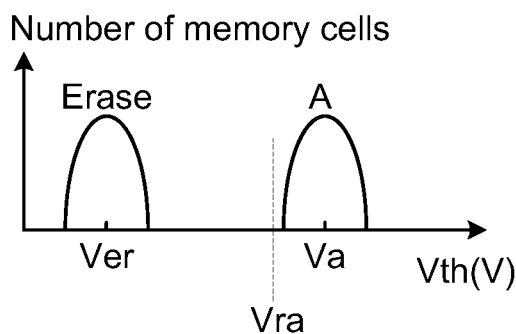
FIG. 2A (prior art) schematically illustrates the ideal threshold voltage distribution curves of single-level cells in different storing states.
Figure 2B:
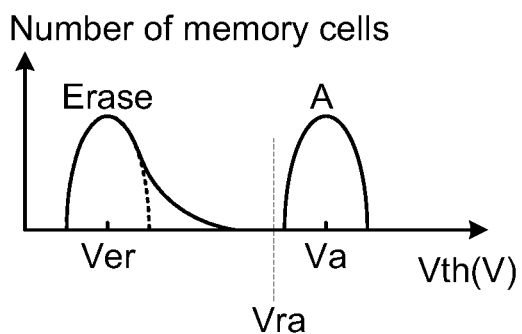
FIG. 2B (prior art) schematically illustrates the shift of the threshold voltage distribution curves of single-level cells in a read disturb mode.
Figure 2C:
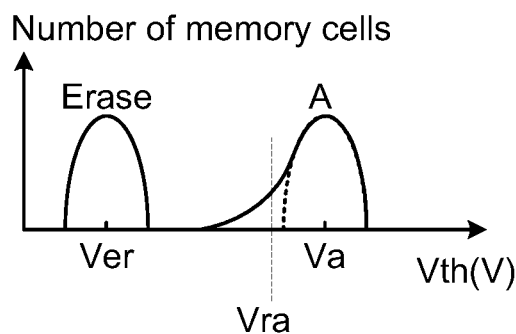
FIG. 2C (prior art) schematically illustrates the shift of the threshold voltage distribution curves of single-level cells in a RTDR failure mode.
Figure 2D:
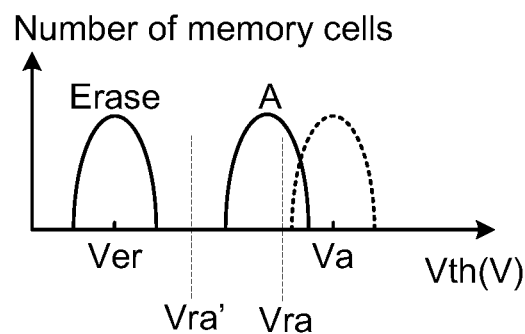
FIG. 2D (prior art) schematically illustrates the shift of the threshold voltage distribution curves of single-level cells in a HTDR failure mode.
Figure 2E:
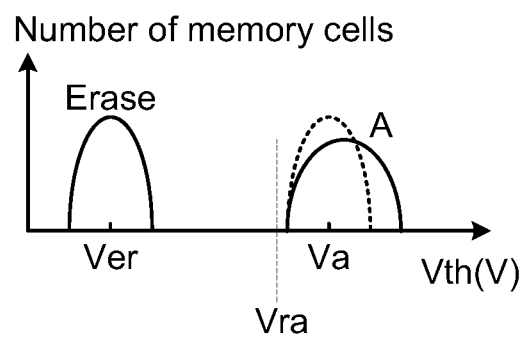
FIG. 2E (prior art) schematically illustrates the shift of the threshold voltage distribution curves of single-level cells in an F-poly coupling failure mode.
Figure 2F:
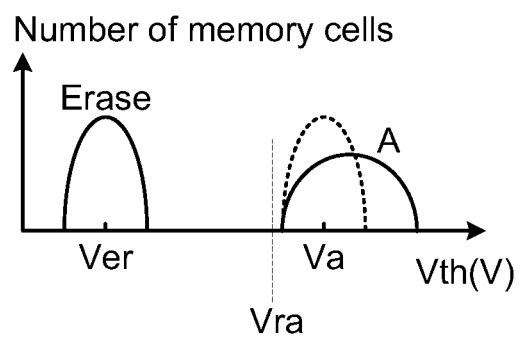
FIG. 2F (prior art) schematically illustrates the shift of the threshold voltage distribution curves of single-level cells in an endurance failure mode.
Figure 3:
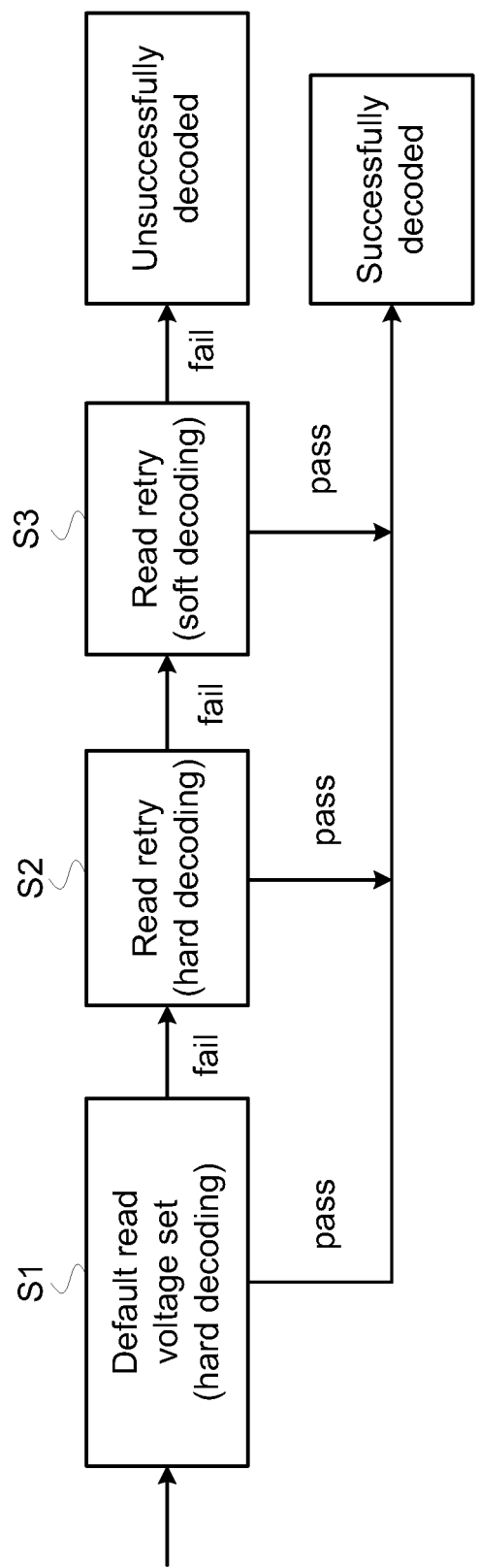
FIG. 3 (prior art) is a flowchart illustrating an error correction method for a solid state storage device according to the prior art.

After the interface controller 101 recognizes the failure mode of the memory cell array 109, an improved error correction method is performed. In comparison with the error correction method of FIG. 3, the error correction method of the present invention can reduce the time period of performing the read retry process.

Figure 9:
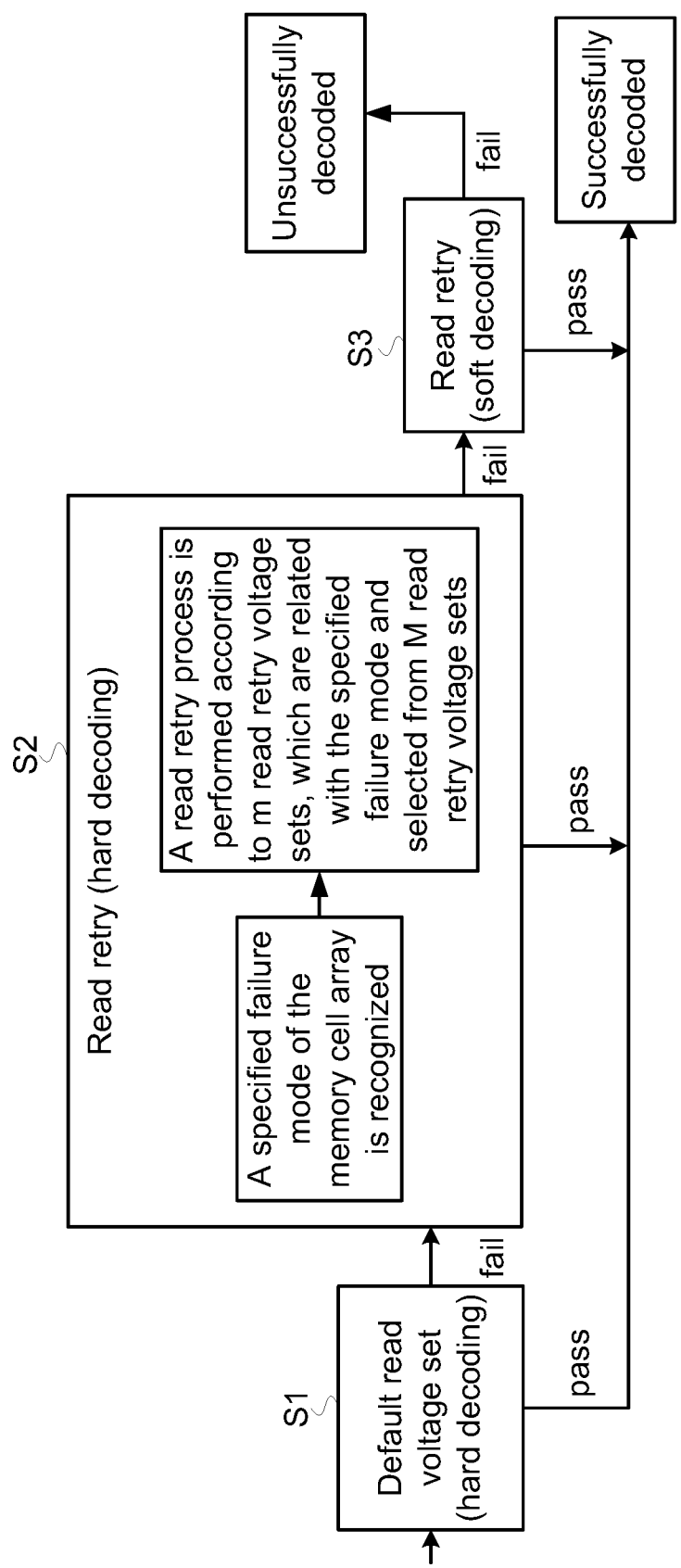
FIG. 9 is a flowchart illustrating an error correction method for a solid state storage device according to an embodiment of the present invention.

FIG. 9 is a flowchart illustrating an error correction method for a solid state storage device according to an embodiment of the present invention. In comparison with the error correction method of FIG. 3, only the decoding process S2 in the error correction method of the present invention is distinguished. Consequently, only the decoding process S2 will be described as follows.

If the error bits in the read data cannot be corrected and the accurate read data is not acquired in the decoding process S1, the decoding process S1 is failed. Then, the interface controller 101 performs the decoding process S2.

Before performing the decoding process S2, the interface controller 101 recognizes a specified failure mode of the memory cell array 109 by using the failure mode detection method of the present invention. Then, m read retry voltage sets related with the specified failure mode are selected from M read retry voltage sets, and a read retry process is performed according to the m read retry voltage sets, wherein M is larger than m.

Since the interface controller 101 has recognized the specified failure mode of the memory cell array 109 and the m read retry voltage sets are related with the specified failure mode, the possibility of successfully decoding the data is increased. Since the data is successfully decoded according to less number of read retry voltage sets, the time period of performing the read retry process is effectively shortened.

From the above descriptions, the present invention provides a failure mode detection method and an error correction method for a solid state storage device. After recognizing the specified failure mode of the memory cell array 109, the interface controller 101 further judges the real operating environment of the solid state storage device 10. During the read retry process of the solid state storage device 10, the interface controller 101 acquires the read retry voltage sets according to the failure mode of the memory cell array 109. Consequently, the time period of performing the read retry process is effectively shortened.

In the above embodiment of the failure mode detection method, the interface controller 101 judges the failure mode of the memory cell array 109 according to the read retry voltages Vrd' and Vrg' of the read retry voltage set. It is noted that numerous modifications and alterations may be made while retaining the teachings of the invention. For example, in another embodiment, the interface controller judges the failure mode of the memory cell array according to any two read retry voltages (e.g., the read retry voltages Vrb' and Vrf') of the read retry voltage set.

For example, in the DR failure mode, the read retry voltages Vrb' and Vrf' of the read retry voltage set are selected, wherein Vrb' is lower than Vrf'. In comparison with the default read voltage Vrb, the read retry voltage Vrb has a shift Δb to the left. In comparison with the default read voltage Vrf, the read retry voltage Vrf' has a shift Δf to the left. If the absolute value of the increment Δf is larger than the absolute value of the increment Δb, the interface controller 101 judges that the memory cell array 109 is in the DR failure mode.

Moreover, the decoding process S2 of the error correction method may be modified. For example, after the suitable read voltages are estimated according to the result of the decoding process S1, the read retry voltage sets related with the specified failure mode and close to the suitable read voltages are selected and a read retry process is performed according to the selected read retry voltage sets.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A failure mode detection method for a solid state storage device, the failure mode detection method comprising steps of:

changing a first default read voltage to a first read retry voltage by a first increment, and changing a second default read voltage to a second read retry voltage by a second increment, wherein when a memory cell array of the solid state storage device is read according to the first read retry voltage and the second read retry voltage, an accurate read data is generated;

if an absolute value of the first increment minus an absolute value of the second increment is larger than a predetermined voltage value, judging that the memory cell array of the solid state storage device is in a data retention failure mode; and if the absolute value of the first increment minus the absolute value of the second increment is not larger than the predetermined voltage value, judging that the memory cell array of the solid state storage device is in a low temperature write high temperature read failure mode.

2. The failure mode detection method as claimed in claim 1, wherein the first read retry voltage is higher than the second read retry voltage, and the first increment and the second increment are negative.

3. A failure mode detection method for a solid state storage device, the failure mode detection method comprising steps of:

changing a first default read voltage to a first read retry voltage by a first increment, and changing a second default read voltage to a second read retry voltage by a second increment, wherein when a memory cell array of the solid state storage device is read according to the first read retry voltage and the second read retry voltage, an accurate read data is generated;

if the first increment is positive and a data storage time exceeds a predetermined time period, judging that the memory cell array of the solid state storage device is in a high temperature write low temperature read failure mode; and if the first increment is positive and the data storage time does not exceed the predetermined time period, judging that the memory cell array of the solid state storage device is in a program disturb failure mode.

4. The failure mode detection method as claimed in claim 3, further comprising steps of:

if the first increment is negative and an absolute value of the first increment minus an absolute value of the second increment is larger than a predetermined voltage value, judging that the memory cell array of the solid state storage device is in a data retention failure mode; and if the first increment is negative and the absolute value of the first increment minus the absolute value of the second increment is not larger than the predetermined voltage value, judging that the memory cell array of the solid state storage device is in a low temperature write high temperature read failure mode.

5. The failure mode detection method as claimed in claim 3, wherein the first read retry voltage is higher than the second read retry voltage.

6. An error correction method for a solid state storage device, the error correction method comprising steps of:

changing a first default read voltage to a first read retry voltage by a first increment, and changing a second default read voltage to a second read retry voltage by a second increment, wherein when a memory cell array of the solid state storage device is read according to the first read retry voltage and the second read retry voltage, an accurate read data is generated, wherein a first read retry voltage set of the m read retry voltage sets includes the first read retry voltage and the second read retry voltage;

if an absolute value of the first increment minus an absolute value of the second increment is larger than a predetermined voltage value, judging that a specified failure mode of the memory cell array is a data retention failure mode; and if the absolute value of the first increment minus the absolute value of the second increment is not larger than the predetermined voltage value, judging that the specified failure mode of the memory cell array is a low temperature write high temperature read failure mode;

selecting m read retry voltage sets from M read retry voltage sets, wherein the m read retry voltage sets are related with the specified failure mode and M is larger than m; and performing a read retry process according to the m read retry voltage sets.

7. The error correction method as claimed in claim 6, further comprising steps of:

if the first increment is positive and a data storage time exceeds a predetermined time period, judging that the specified failure mode is a high temperature write low temperature read failure mode; and if the first increment is positive and the data storage time does not exceed the predetermined time period, judging that the specified failure mode is a program disturb failure mode.

8. The error correction method as claimed in claim 6, further comprising steps of:

if the first increment is negative and an absolute value of the first increment minus an absolute value of the second increment is larger than a predetermined voltage value, judging that the specified failure mode is a data retention failure mode; and if the first increment is negative and the absolute value of the first increment minus the absolute value of the second increment is not larger than the predetermined voltage value, judging that the specified failure mode is a low temperature write high temperature read failure mode.

\* \* \* \* \*